US009927694B2

(12) United States Patent
Ugajin

(10) Patent No.: US 9,927,694 B2
(45) Date of Patent: Mar. 27, 2018

(54) PATTERN DATA GENERATION METHOD, PATTERN DATA GENERATION DEVICE, AND MASK

(71) Applicant: Toshiba Memory Corporation, Tokyo (JP)

(72) Inventor: Kunihiro Ugajin, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 23 days.

(21) Appl. No.: 15/069,534

(22) Filed: Mar. 14, 2016

(65) Prior Publication Data

US 2017/0075228 A1 Mar. 16, 2017

(30) Foreign Application Priority Data

Sep. 14, 2015 (JP) ................................. 2015-180905

(51) Int. Cl.
| | | |
|---|---|---|
| *H01L 21/302* | (2006.01) | |
| *G03B 27/52* | (2006.01) | |
| *G03F 1/26* | (2012.01) | |
| *G06F 17/50* | (2006.01) | |
| *G03F 1/36* | (2012.01) | |

(52) U.S. Cl.
CPC .................. *G03F 1/26* (2013.01); *G03F 1/36* (2013.01); *G06F 17/5068* (2013.01)

(58) Field of Classification Search
CPC ............. G06F 17/5068; G06F 17/5081; G06F 2217/12; G06F 17/5009; G06F 17/5045; G06F 2217/02; G06F 2217/06; G06F 2217/64; G03F 1/36; G03F 1/26; G03F 1/70; G03F 7/705; G03F 1/50; G03F 7/70625; G03F 1/144; G03F 1/20; G03F 1/72; G03F 7/0002
See application file for complete search history.

(56) References Cited

U.S. PATENT DOCUMENTS

| | | | |
|---|---|---|---|
| 8,826,198 B2 | 9/2014 | Tsai et al. | |
| 2004/0209170 A1* | 10/2004 | Broeke | G03F 7/70441 430/5 |
| 2015/0316841 A1* | 11/2015 | Misaka | G03F 1/28 430/5 |

FOREIGN PATENT DOCUMENTS

| | | |
|---|---|---|
| JP | 2008-122722 | 5/2008 |
| JP | 2010-191009 | 9/2010 |
| JP | 2011-128483 | 6/2011 |

* cited by examiner

*Primary Examiner* — Mesfin Asfaw
(74) *Attorney, Agent, or Firm* — Finnegan, Henderson, Farabow, Garrett & Dunner, L.L.P.

(57) ABSTRACT

A pattern data generation method includes setting drawing pattern data based on design pattern data including first and second pattern regions. The drawing pattern data includes third and fourth pattern regions. The method includes setting the width of the third pattern region to a third width. The method includes setting first and second irradiation amount data based on the drawing pattern data. The method includes calculating a first thickness of the first pattern region and a second thickness of the second pattern region based on the first irradiation amount data, and calculating a third thickness of the third pattern region based on the second irradiation amount data. The method includes calculating, based on the first to third widths and the first to third thicknesses, a range of a first exposed region exposed onto a patterning substrate.

20 Claims, 8 Drawing Sheets

PATTERN DATA GENERATION METHOD, PATTERN DATA GENERATION DEVICE, AND MASK

CROSS-REFERENCE TO RELATED APPLICATIONS

This application is based upon and claims the benefit of priority from Japanese Patent Application No. 2015-180905, filed on Sep. 14, 2015; the entire contents of which are incorporated herein by reference.

FIELD

Embodiments described herein relate generally to a pattern data generation method, a pattern data generation device and a mask.

BACKGROUND

A phase shift mask, in which projected light that passes through adjacent patterns has a phase difference of 180 degrees, is employed in the lithography process of a semiconductor integrated circuit. In addition to the main pattern, a fine assist pattern called SRAF (Sub Resolution Assist Features) is used in the phase shift mask. The main pattern is transferred onto the wafer. The assist pattern utilizes the interference of the light to improve the transferability of the main pattern. The assist pattern is not transferred onto the wafer. The method for generating pattern data in a computer is implemented to obtain the phase shift mask including the assist pattern. It is desirable for such a method to generate high-precision pattern data.

DETAILED DESCRIPTION

Figure 1:
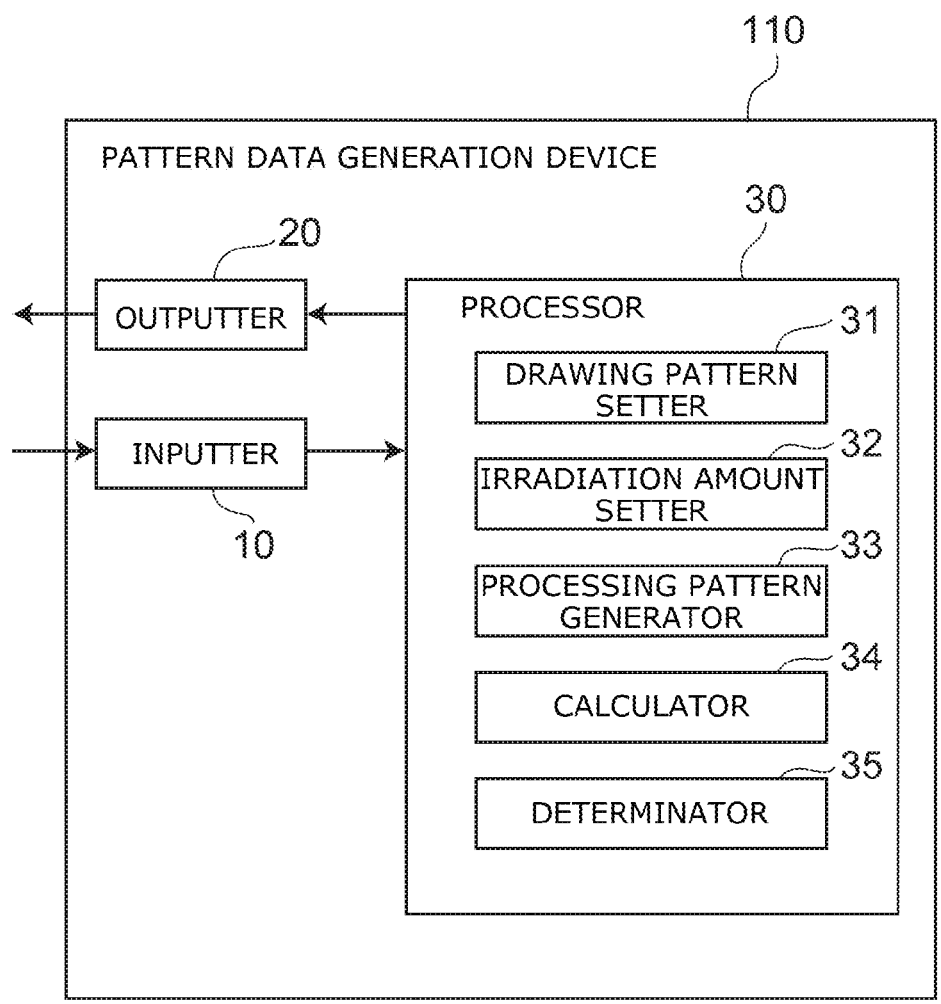
FIG. 1 is a block diagram showing a pattern data generation device according to a first embodiment.

According to one embodiment, a pattern data generation method includes setting drawing pattern data based on design pattern data. The design pattern data includes a first pattern region and a second pattern region. The first pattern region corresponds to a first pattern of a mask and has a first width. The second pattern region corresponds to a second pattern and has a second width narrower than the first width. The second pattern is arranged with the first pattern. The drawing pattern data includes a third pattern region and a fourth pattern region. The third pattern region is arranged with the second pattern region and has a width narrower than the first width. The method includes setting the width of the third pattern region to a third width. The method includes setting first irradiation amount data and second irradiation amount data based on the drawing pattern data. The first irradiation amount data relates to a value of a first irradiation amount per unit surface area of the fourth pattern region. The second irradiation amount data relates to a value of a second irradiation amount per unit surface area of the third pattern region. The value of the second irradiation amount is less than the value of the first irradiation amount. The method includes calculating and setting a first thickness of the first pattern region and a second thickness of the second pattern region based on the first irradiation amount data, and calculating and setting a third thickness of the third pattern region based on the second irradiation amount data. The third thickness is thinner than the second thickness. The method includes calculating and setting, based on the first to third widths and the first to third thicknesses, a range of a first exposed region exposed onto a patterning substrate.

According to another embodiment, a pattern data generation device includes an inputter and a processor. The inputter receives input of design pattern data of a mask. The mask includes a first pattern and a second pattern. The second pattern is arranged with the first pattern. The design pattern data includes a first pattern region and a second pattern region. The first pattern region corresponds to the first pattern and has a first width. The second pattern region corresponds to the second pattern and has a second width narrower than the first width. The processor implements setting drawing pattern data based on the design pattern data. The drawing pattern data includes a third pattern region and a fourth pattern region. The third pattern region is arranged with the second pattern region. The third pattern region has a width narrower than the first width. The processor implements setting the width of the third pattern region to a third width. The processor implements setting first irradiation amount data and second irradiation amount data based on the drawing pattern data. The first irradiation amount data relates to a value of a first irradiation amount per unit surface area of the fourth pattern region. The second irradiation amount data relates to a value of a second irradiation amount per unit surface area of the third pattern region. The value of the second irradiation amount is less than the value of the first irradiation amount. The processor implements calculating and setting a first thickness of the first pattern region and a second thickness of the second pattern region based on the first irradiation amount data, and calculating and setting a third thickness of the third pattern region based on the second irradiation amount data. The third thickness is thinner than the second thickness. The processor implements calculating and setting a range of a first exposed region based on the first to third widths and the first to third thicknesses. The first exposed region is exposed onto a patterning substrate.

According to another embodiment, a mask includes a substrate, a first pattern, a second pattern, and a third pattern. The first pattern is provided on the substrate. The first pattern has a first width and a first thickness. The second pattern is provided on the substrate. The second pattern is arranged with the first pattern. The second pattern has a second width and a second thickness. The second width is narrower than the first width. The third pattern is provided on the substrate. The third pattern is arranged with the second pattern. The third pattern has a third thickness and a third width. The third thickness is thinner than the second thickness. The third width is narrower than the first width.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In this specification and each drawing, components similar to ones described in reference to an antecedent drawing are marked with the same reference numerals, and a detailed description is omitted as appropriate.

First Embodiment

FIG. 1 is a block diagram showing a pattern data generation device according to a first embodiment.

The pattern data generation device 110 according to the embodiment includes an inputter 10, an outputter 20, and a processor 30.

The inputter 10 includes, for example, an input terminal. The inputter 10 includes an input interface that communicates with the outside via a wired or wireless method. The outputter 20 includes, for example, an output terminal. The outputter 20 includes an output interface that communicates with the outside via a wired or wireless method. The processor 30 includes, for example, a calculating device including a CPU (Central Processing Unit), memory, etc. A portion of each block or each entire block of the processor 30 may include an integrated circuit such as LSI (Large Scale Integration), etc., or an IC (Integrated Circuit) chipset. Each block may include an individual circuit; or a circuit in which some or all of the blocks are integrated may be used. The blocks may be provided as one body; or some blocks may be provided separately. Also, for each block, a portion of the block may be provided separately. The integration is not limited to LSI; and a dedicated circuit or a general-purpose processor may be used.

A drawing pattern setter 31, an irradiation amount setter 32, a processing pattern generator 33, a calculator 34, and a determinator 35 are provided in the processor 30. For example, these components are realized as a pattern data generation program. In other words, the pattern data generation device 110 also may be realized by using a general-purpose computer device as the basic hardware. The functions of each component included in the pattern data generation device 110 may be realized by causing a processor mounted in the computer device recited above to execute the pattern data generation program. In such a case, the pattern data generation device 110 may be realized by preinstalling the pattern data generation program recited above in the computer device; or the pattern data generation device 110 may be realized by storing the pattern data generation program recited above in a storage medium such as CD-ROM, etc., or distributing the pattern data generation program recited above via a network and appropriately installing the pattern data generation program in the computer device. The processor 30 also may be realized by appropriately utilizing a storage medium such as memory, a hard disk, CD-R, CD-RW, DVD-RAM, DVD-R, etc., connected externally or built into the computer device recited above.

Figure 2:
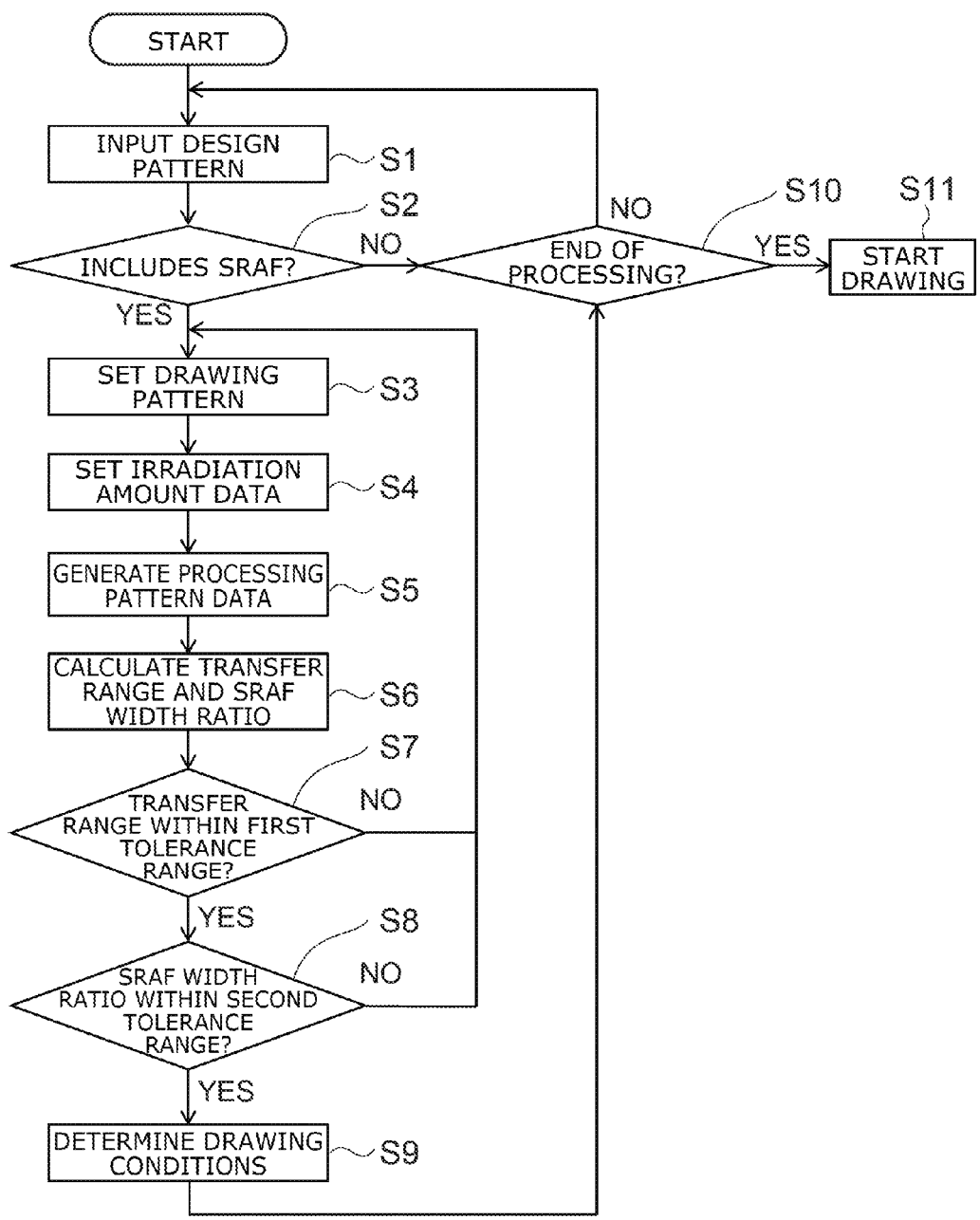
FIG. 2 is a flowchart showing a pattern data generation method according to the first embodiment.

FIG. 2 is a flowchart showing a pattern data generation method according to the first embodiment.

Figure 3A:
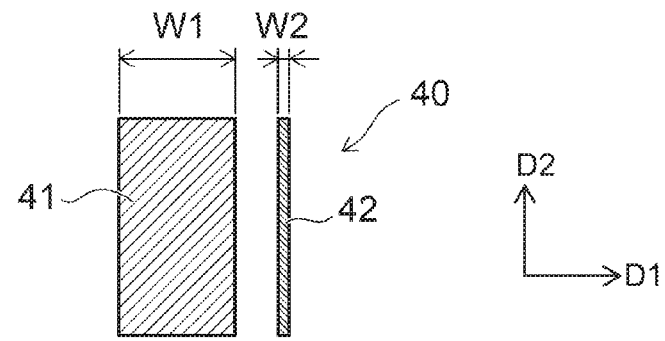
FIG. 3A to FIG. 3C are schematic views showing pattern data according to the first embodiment.
Figure 3B:
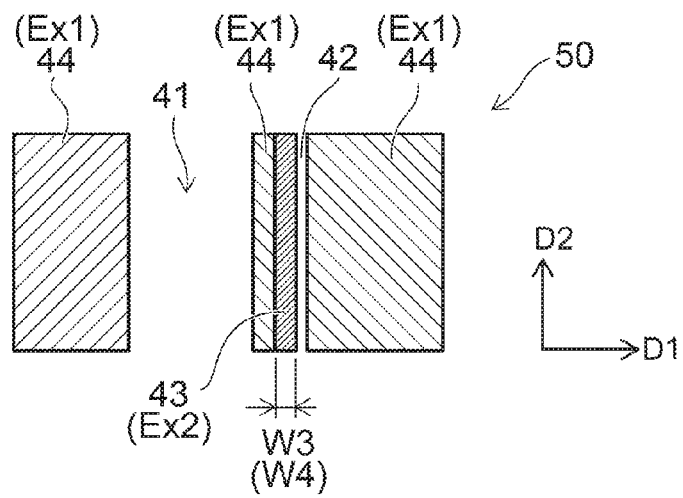
Figure 3C:
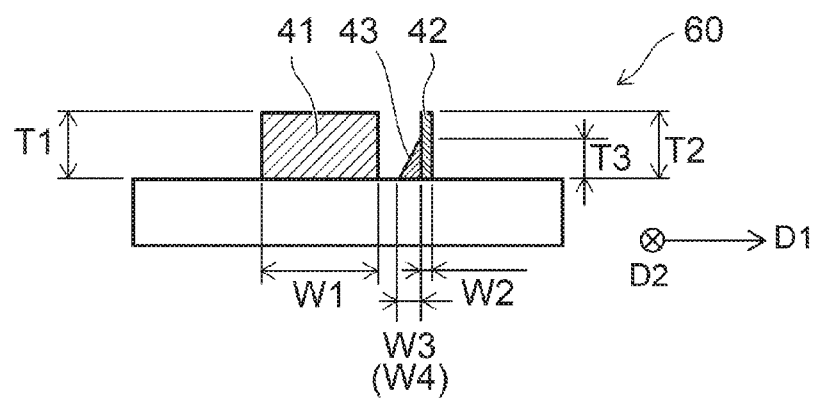

FIG. 3A to FIG. 3C are schematic views showing pattern data according to the first embodiment.

FIG. 3A shows design pattern data of a mask; FIG. 3B shows drawing pattern data of the mask; and FIG. 3C shows processing pattern data of the mask.

The pattern data generation method shown in FIG. 2 is implemented using the pattern data generation device 110 of FIG. 1.

The inputter 10 receives the input of design pattern data 40 of the mask such as that shown in FIG. 3A (step S1). Here, for example, the design pattern data 40 refers to CAD (Computer Aided Design) data. The mask includes a first pattern, and a second pattern positioned at the vicinity of the first pattern. The first pattern also is called the main pattern and is transferred onto a wafer. The second pattern also is called an assist pattern or a SRAF (Sub Resolution Assist Feature) pattern and is not transferred onto the wafer.

In the example of FIG. 3A, the design pattern data 40 includes a first pattern region 41 and a second pattern region 42. The first pattern region 41 corresponds to the first pattern and has a first width W1. The second pattern region 42 corresponds to the second pattern and has a second width W2 that is narrower than the first width W1.

The processor 30 determines whether or not the design pattern data 40 includes SRAF data (step S2). Specifically, it is possible to determine whether or not SRAF data is included by recognizing the arrangement, configuration, etc., of the pattern data included in the design pattern data 40. In the case where it is determined that SRAF data is included (the case of YES in step S2), the flow proceeds to step S3. In the case where it is determined that SRAF data is not included (the case of NO in step S2), the flow proceeds to step S10.

Here, one direction from the second pattern region 42 toward the first pattern region 41 (or from the first pattern region 41 toward the second pattern region 42) when the design pattern data 40 is displayed on a screen of the pattern data generation device 110 is taken as a first direction D1. The first width W1 is the length along the first direction D1 of the first pattern region 41. The second width W2 is the length along the first direction D1 of the second pattern region 42. One direction orthogonal to the first direction D1 is taken as a second direction D2. In the example, the second pattern region 42 extends in the second direction D2 and is arranged with the first pattern region 41 in the first direction D1.

The drawing pattern setter 31 sets drawing pattern data 50 shown in FIG. 3B (step S3). The drawing pattern data 50 is set based on the design pattern data 40. The drawing pattern data 50 includes a first pattern region 41 that is not to be drawn, a second pattern region 42 that is not to be drawn, a third pattern region 43 that is to be drawn, and a fourth pattern region 44 that is to be drawn.

For example, an electron beam is used to draw the third pattern region 43 and the fourth pattern region 44. The first pattern region 41 and the second pattern region 42 are regions that are not drawn. The drawing pattern data 50 is inverted from the design pattern data 40 because a positive-type resist is assumed in the example. The third pattern region 43 is adjacent to the second pattern region 42. For example, the third pattern region 43 is positioned on one side of the second pattern region 42. The width of the third pattern region 43 is narrower than the first width W1. Here, the width of the third pattern region 43 is set to a third width W3. The third width W3 may be wider than the second width W2. For example, the third width W3 is the length along the first direction D1 of the third pattern region 43.

The irradiation amount setter 32 sets irradiation amount data relating to the value of the irradiation amount in each region (step S4). Namely, as shown in FIG. 3B, first irradiation amount data Ex1 that relates to the value of a first irradiation amount for the fourth pattern region 44 is set based on the drawing pattern data 50. Second irradiation amount data Ex2 that relates to the value of a second irradiation amount for the third pattern region 43 is set. For example, the first irradiation amount data Ex1 and the second irradiation amount data Ex2 respectively include values of the irradiation amounts per unit surface area of the electron beam. The value of the second irradiation amount is less than the value of the first irradiation amount.

The processing pattern generator 33 generates processing pattern data 60 of the mask as shown in FIG. 3C (step S5). Namely, a first thickness T1 of the first pattern region 41 and a second thickness T2 of the second pattern region 42 are calculated based on the first irradiation amount data Ex1. A third thickness T3 of the third pattern region 43 is calculated based on the second irradiation amount data Ex2. The third thickness T3 is thinner than the second thickness T2. The third thickness T3 is, for example, not less than 0.3 times and not more than 0.7 times the second thickness T2. The first thickness T1 and the second thickness T2 are substantially the same. The processing pattern data 60 includes the first to third widths W1 to W3 and the first to third thicknesses T1 to T3.

The first thickness T1 of the first pattern region 41, the second thickness T2 of the second pattern region 42, and the third thickness T3 of the third pattern region 43 are calculatable based on the values of the irradiation amounts that are set. The value of the second irradiation amount is less than the value of the first irradiation amount. Therefore, the third thickness T3 is thinner than the second thickness T2.

FIG. 3C shows the mask configuration after the processing that is estimated based on the processing pattern data 60, i.e., the first to third widths W1 to W3 and the first to third thicknesses T1 to T3. In the example, the cross-sectional configuration when the mask after the processing is viewed from the side is shown.

As shown in FIG. 3C, the width of the third pattern region 43 narrows continuously from the lower layer side toward the upper layer side. The width of the third pattern region 43 on the lower layer side is wide; and the width of the third pattern region 43 on the upper layer side is narrow. The third pattern region 43 has a tapered surface. In such a case, the third width W3 is the maximum width of the third pattern region 43. The third thickness T3 is the maximum thickness of the third pattern region 43. The irradiation amount setter 32 sets the value of the second irradiation amount to increase away from the second pattern region 42 in the first direction D1. Thereby, it is possible to reflect the third pattern region 43 that has the tapered surface in the processing pattern data 60.

The calculator 34 calculates the range of a first exposed region exposed onto a patterning substrate based on the processing pattern data 60. The patterning substrate is, for example, a wafer. The first exposed region is, for example, an exposed region on the wafer that is determined based on the processing pattern data 60. For example, the range of the first exposed region is taken to be the transfer range of the first pattern of the wafer when the first pattern is transferred onto the wafer. Hereinbelow, the range of the first exposed region is called the transfer range. The calculator 34 calculates the SRAF width ratio (step S6). The transfer range can be determined from the fluctuation range of the exposure amount per unit surface area of the patterning substrate and the fluctuation range of the focal position of the patterning substrate. The SRAF width ratio is the ratio of the second width W2 to the third width W3 (i.e., W2/W3).

The determinator 35 determines whether or not the transfer range is contained within a first tolerance range (step S7). In the case where it is determined that the transfer range is not contained within the first tolerance range (the case of NO in step S7), the third width W3 is modified to a fourth width W4. That is, the width of the third pattern region 43 is set to the fourth width W4 that is different from the third width W3. Then, the flow returns to step S3; and the processing is repeated. In the case where it is determined that the transfer range is contained within the first tolerance range (the case of YES in step S7), the flow proceeds to step S8. The transfer range also is called the lithography margin and is an index of whether or not stable pattern formation can be performed. The transfer range and the first tolerance range are described below.

In step S7, stable pattern formation is possible in the case where the transfer range is contained within the first tolerance range; and there is a possibility that stable pattern formation cannot be performed in the case where the transfer range is not contained within the first tolerance range.

The determinator 35 determines whether or not the SRAF width ratio is contained within a second tolerance range (step S8). In the case where it is determined that the SRAF width ratio is not contained within the second tolerance range (the case of NO in step S8), the third width W3 is modified to the fourth width W4; the flow returns to step S3; and the processing is repeated. In the case where it is determined that the SRAF width ratio is contained within the second tolerance range (the case of YES in step S8), the flow proceeds to step S9. Step S7 and step S8 may have the reverse order.

The SRAF width ratio in step S8 can be expressed by W2/W3. The second pattern is formed on the mask based on the second pattern region 42 of the data. Similarly, a third pattern is formed on the mask based on the third pattern region 43 of the data. The SRAF width ratio is an index of the ease of collapse of the second pattern. If the third width W3 is sufficiently large with respect to the second width W2, the second pattern is strongly supported by the third pattern. Therefore, it is considered that the second pattern does not collapse easily. In such a case, for example, it is sufficient to set the second tolerance range to be 1 or less.

In the case where the SRAF width ratio is contained within the second tolerance range, the possibility of the collapse of the second pattern is low; and in the case where the SRAF width ratio is not contained within the second tolerance range, the possibility of the collapse of the second pattern is high. The SRAF width ratio is not limited to the example. The second tolerance range is appropriately set according to the method for determining the SRAF width ratio.

The determinator 35 determines the width of the third pattern region 43 to be the third width W3 when the transfer range is contained within the first tolerance range and the SRAF width ratio is contained within the second tolerance range. Thereby, the drawing conditions for the mask formation are determined (step S9). The drawing conditions include the values of the irradiation amounts for each region. In this case, the drawing conditions include the first irradiation amount data Ex1 for the fourth pattern region 44 and the second irradiation amount data Ex2 for the third pattern region 43.

The processor 30 determines whether or not a series of processing has ended (step S10). In the case where the series of processing has ended (the case of YES in step S10), the drawing for the mask formation using a mask pattern drawing device (not shown) is started according to the drawing conditions determined in step S9 (step S11). In the case where the series of processing has not ended (the case of NO in step S10), the flow returns to step S1; and the next design pattern data 40 is input.

Here, when the transfer range is not contained within the first tolerance range or when the SRAF width ratio is not contained within the second tolerance range, the third width W3 is modified to the fourth width W4; and step S3 and the subsequent steps are repeatedly implemented.

In step S3, the drawing pattern setter 31 sets the drawing pattern data 50 including the third pattern region 43 in which the fourth width W4 is set as shown in FIG. 3B based on the design pattern data 40.

In step S4, the irradiation amount setter 32 sets the first irradiation amount data Ex1 and the second irradiation amount data Ex2 as shown in FIG. 3B based on the drawing pattern data 50. At this time, the value of the second irradiation amount for the third pattern region 43 may be modified.

In step S5, the processing pattern generator 33 generates the processing pattern data 60 as shown in FIG. 3C. The processing pattern data 60 includes the first width W1, the second width W2, the fourth width W4, and the first to third thicknesses T1 to T3.

In step S6, the calculator 34 calculates the transfer range based on the first width W1, the second width W2, the fourth width W4, and the first to third thicknesses T1 to T3. The calculator 34 calculates the ratio of the second width W2 to the fourth width W4 (i.e., W2/W4).

In step S7 and step S8, the determinator 35 further modifies the fourth width W4 to a fifth width W5 when the transfer range is not contained within the first tolerance range and/or when the ratio of the second width W2 to the fourth width W4 is not contained within the second tolerance range. That is, the width of the third pattern region 43 is set to the fifth width W5. Then, the flow returns to step S3; and the processing is repeated. Also, the width of the third pattern region 43 is determined to be the fourth width W4 when the transfer range is contained within the first tolerance range and when the ratio of the second width W2 to the fourth width W4 is contained within the second tolerance range.

Thus, according to the embodiment, the width of the third pattern region 43 is determined so that the transfer range of the first pattern is contained within the first tolerance range, and the SRAF width ratio is contained within the second tolerance range. The optimal drawing conditions that include the irradiation amounts for each region can be determined. Thereby, the drawing conditions for which stable pattern formation is possible can be derived. The drawing conditions for which the collapse of the second pattern is suppressible can be derived. High-precision pattern data can be generated.

The mask is manufactured based on the pattern data generated by the embodiment. The mask has a pattern size that is equal to or less than the resolution limit of the optical system.

Figure 4A:
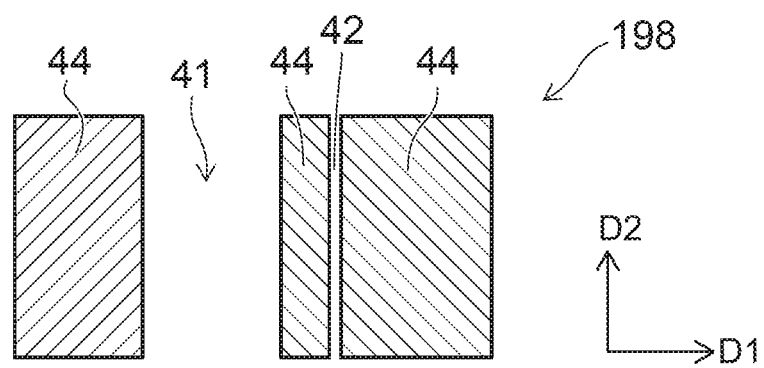
FIG. 4A and FIG. 4B are schematic views showing a mask pattern data according to a reference example.
Figure 4B:
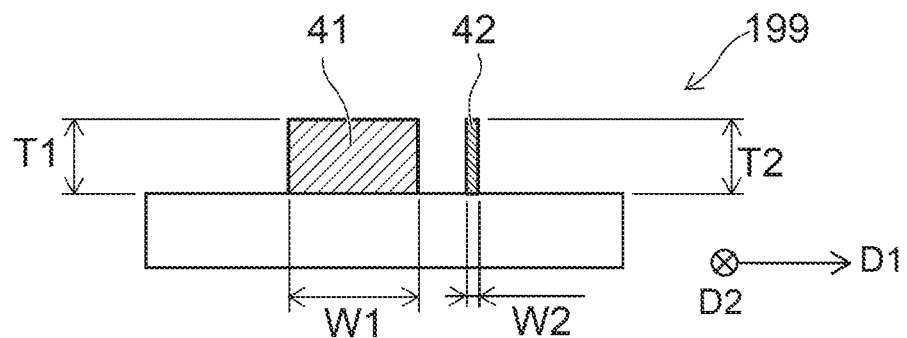

FIG. 4A and FIG. 4B are schematic views showing a mask pattern data according to a reference example.

FIG. 4A shows the drawing pattern data of a mask; and FIG. 4B shows the processing pattern data of the mask.

The drawing pattern data 198 according to the reference example includes the first pattern region 41 that is not to be drawn, the second pattern region 42 that is not to be drawn, and the fourth pattern region 44 that is to be drawn. Unlike the embodiment, the third pattern region 43 is not set in the drawing pattern data 198. Therefore, only the first pattern region 41 and the second pattern region 42 are included in the processing pattern data 199; and the third pattern region 43 is not included in the processing pattern data 199.

Therefore, the third pattern that supports the second pattern does not exist in the actual mask formed based on the processing pattern data 199. Therefore, there is a possibility that the second pattern may collapse in the cleaning process, etc., of the mask.

Conversely, according to the embodiment, the third pattern that supports the second pattern is provided in the actual mask formed based on the processing pattern data 60. The width of the third pattern region 43 in the data is determined based on the ratio of the second pattern region 42 to the second width W2 in the data so that the second pattern does not collapse easily. Therefore, it is possible to suppress the collapse of the second pattern in the cleaning process, etc., of the mask.

The third pattern region 43 is adjacent to the second pattern region 42. By setting the third pattern region 43, there are cases where the transfer range changes when the first pattern is transferred onto the wafer. It is considered that this is caused by the exposure amount and/or focal position fluctuating due to the third pattern region 43. From the perspective of the transferability of the first pattern, it is desirable for the transfer range to be contained within a prescribed tolerance range. From the perspective of suppressing the collapse of the second pattern, it is desirable for the width of the third pattern to be wide. However, if the width of the third pattern region 43 is too wide, there are cases where the transfer range is not contained within the prescribed tolerance range. In such a case, there is a possibility that stable pattern formation is not possible.

The transfer range when the first pattern is transferred onto the wafer is designed to be widest when the phase shift in the second pattern region 42 is 180 degrees. In the embodiment, a phase shift film that has a lower height than the film of the second pattern region 42 is made by providing the third pattern region 43 to be adjacent to the second pattern region 42. The phase shift amount of the phase shift film having the lower height is less than 180 degrees. The effect of the phase shift decreases as the third pattern region 43 becomes large. Therefore, the third pattern region 43 is determined so that the transfer range of the first pattern on the wafer is contained within the tolerance range.

The transfer range and the first tolerance range will now be described based on FIG. 5 to FIG. 6C.

Figure 5:
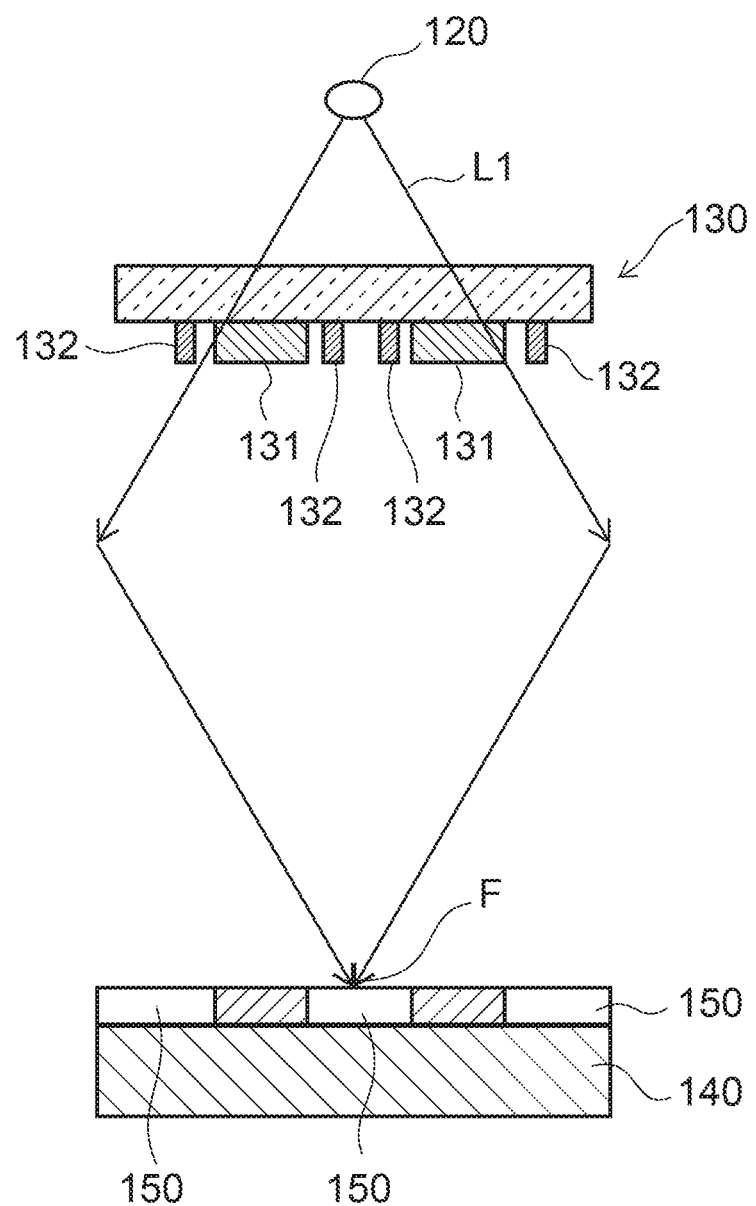
FIG. 5 is a schematic view showing the relationship between the exposure apparatus and the transfer range.

FIG. 5 is a schematic view showing the relationship between the exposure apparatus and the transfer range.

As shown in FIG. 5, light L1 that is emitted from a light source 120 reaches a mask 130. A first pattern 131 and a second pattern 132 are provided in the mask 130. The light that passes through the mask 130 becomes exposure light L2. The exposure light L2 is irradiated on a photoresist 150 provided on a wafer 140; and the first pattern 131 of the mask 130 is transferred onto the photoresist 150. For example, an argon fluoride (ArF) laser light source or the like is used as the light source 120.

An exposure amount (e.g., a dose) Ep of the exposure light L2 per unit surface area of the wafer 140 and a focal position F at the wafer 140 fluctuate due to various factors of the processes. The range in which the image of the first pattern 131 is formable on the wafer 140 is calculated using an optical simulator for the fluctuation range of the exposure amount Ep and the fluctuation range of the focal position F. Thereby, the transfer range of the first pattern 131 can be derived.

A method for lithography design is implemented using a computer. Thereby, the fluctuation error of the components related to photolithography such as the mask, the exposure apparatus, the resist material, etc., can be handled quantitatively.

Figures 6A, 6B, 6C:
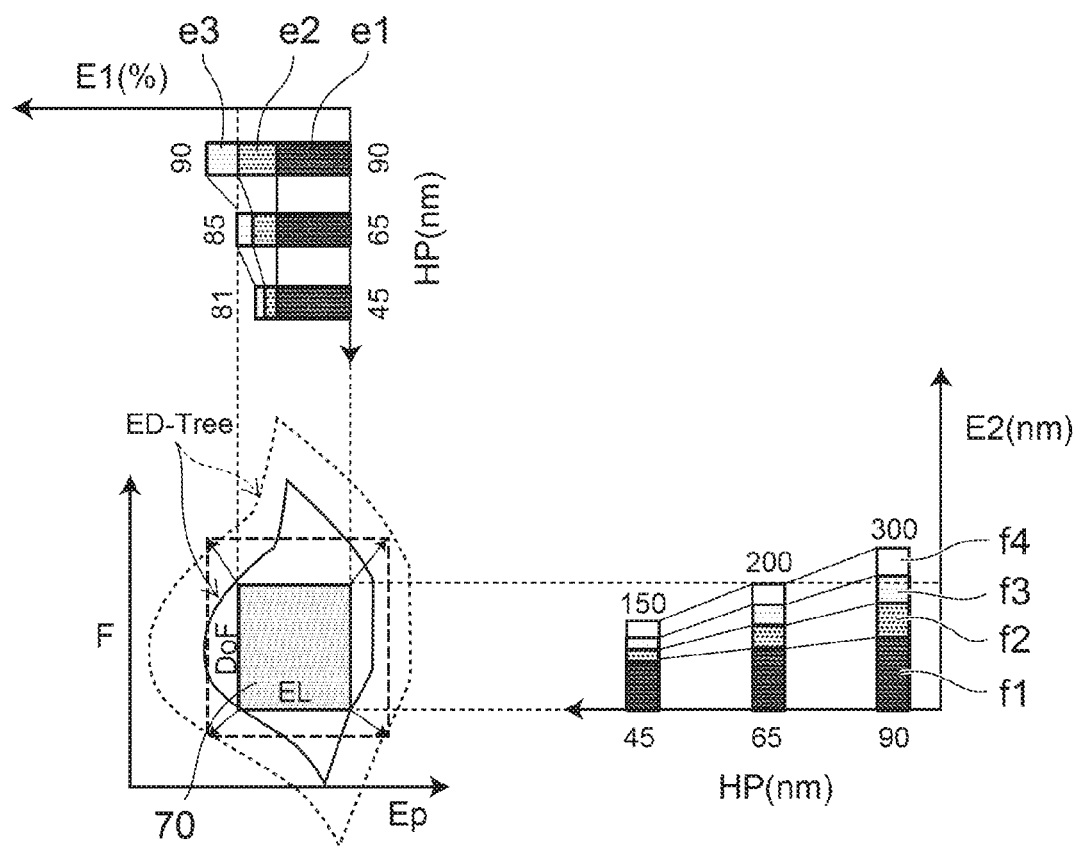
FIG. 6A to FIG. 6C are graphs of the concept of the lithography design.

FIG. 6A to FIG. 6C are graphs of the concept of the lithography design.

FIG. 6A is a graph of the ED (Exposure Defocus) window.

In the figure, the vertical axis is the focal position F; and the horizontal axis is the exposure amount Ep.

In the photolithography, the dimension (the range) of the pattern formed on the wafer is determined by the focal position and the exposure amount per unit surface area. The usable optical conditions and the resist performance are predicted; and ED-Tree (Exposure Defocus Tree) analysis by simulation is performed. ED-Tree analysis is an analysis method in which the exposure amount and the dimension and the focal position and the dimension are considered simultaneously. Thereby, the fluctuation suppression amount of the exposure amount and the focal position necessary for manufacturing within the tolerable dimensional fluctuation are estimated.

An ED window 70 of FIG. 6A shows the fluctuation suppression amount of the exposure amount and the focal position. In the ED window 70, EL is the exposure amount margin (Exposure Latitude); and DoF is the depth of focus or the focus margin.

In parallel to the ED window 70, analysis of the factors that cause the fluctuation of the exposure amount and the focal position is performed; and the target values to be achieved for the exposure amount and the focal position are calculated. Factor tables are made to calculate the target values. The factors relating to the exposure amount are, for example, the dose budget. The factors relating to the focal position are, for example, the focus budget.

FIG. 6B is a graph of the dose budget.

In the figure, the vertical axis is a minimum circuit line width HP (Half Pitch); and the horizontal axis is an effective dose error E1 (units: %). The units of the minimum circuit line width HP are nanometers (nm).

As shown in FIG. 6B, the breakdown of the effective dose error E1 includes, for example, factors e1 to e3. The factor e1 is the error caused by the mask CD (Critical Dimension (minimum line width)). The factor e2 is the error caused by the resist process. The factor e3 is the error caused by the exposure apparatus. The dose budget includes quantified fluctuation factors (errors) of the exposure amount.

FIG. 6C is a graph of the focus budget.

In the figure, the vertical axis is a focus error E2 (units: nm); and the horizontal axis is the minimum circuit line width HP (units: nm).

As shown in FIG. 6C, the breakdown of the focus error E2 includes, for example, factors f1 to f4. The factor f1 is the error caused by the exposure apparatus (the aberration and the autofocus). The factor f2 is the error caused by the wafer flatness. The factor f3 is the error caused by the mask flatness. The factor f4 is the error caused by the difference in levels of the device. The focus budget includes quantified fluctuation factors (errors) of the focal position.

The simulation and the budget analysis are repeated until the ED window 70 exceeds the sum total of the fluctuation factors of the exposure amount and the focal position. Thus, the ED window 70 is derived. The range of the ED window 70 means the transfer range in which stable pattern formation is possible.

In the embodiment, for example, the first tolerance range can be set to be the ED window 70. The transfer range of the first pattern can be calculated using the method described in reference to FIG. 5. The modification of the width of the third pattern region 43 also affects the transfer range of the first pattern. Therefore, the range (i.e., the transfer range) where the image of the first pattern is formed on the photoresist is calculated using an optical simulator for the fluctuation range of the exposure amount and the fluctuation range of the focal position each time the width of the third pattern region 43 is modified. Then, it is determined whether or not the transfer range obtained by the calculation is contained in the ED window 70.

Thus, according to the embodiment, the width of the third pattern region 43 is determined so that the transfer range of the first pattern is contained within the first tolerance range and the SRAF width ratio is contained within the second tolerance range. The optimal drawing conditions including the irradiation amounts for each region can be determined. Thereby, the drawing conditions for which stable pattern formation is possible can be derived. The drawing conditions for which the collapse of the second pattern is suppressible can be derived. High-precision pattern data can be generated.

Second Embodiment

Figure 7A:
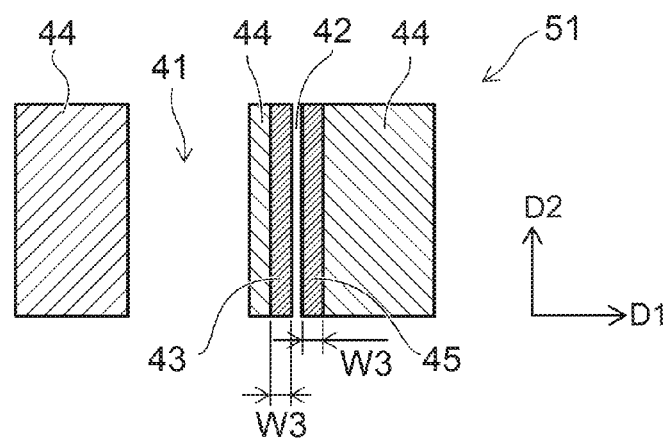
FIG. 7A and FIG. 7B are schematic views showing pattern data according to a second embodiment.
Figure 7B:
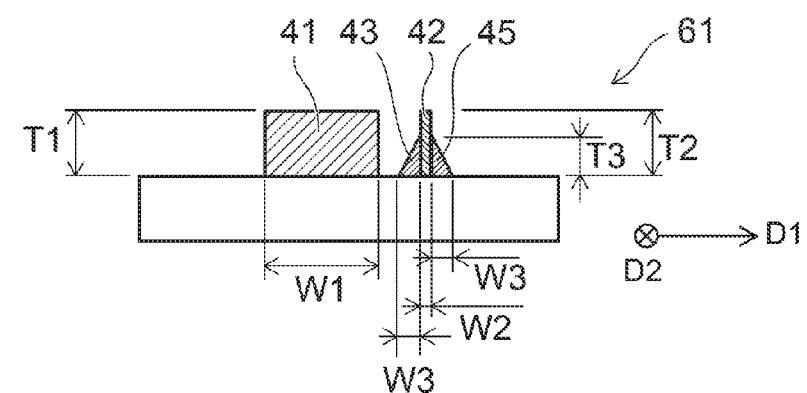

FIG. 7A and FIG. 7B are schematic views showing pattern data according to a second embodiment.

FIG. 7A shows the drawing pattern data of a mask; and FIG. 7B shows the processing pattern data of the mask.

As shown in FIG. 7A, the drawing pattern data 51 further includes a fifth pattern region 45. The fifth pattern region 45 is adjacent to the second pattern region 42. For example, the width of the fifth pattern region 45 is set to the third width W3. For example, the fifth pattern region 45 has the third thickness T3. The second pattern region 42 is positioned between the third pattern region 43 and the fifth pattern region 45.

As shown in FIG. 7B, for example, the width of the fifth pattern region 45 narrows continuously from the lower layer side toward the upper layer side. The width of the fifth pattern region 45 on the lower layer side is wide; and the width of the fifth pattern region 45 on the upper layer side is narrow. The fifth pattern region 45 has a tapered surface. In such a case, the third width W3 is the maximum width of the fifth pattern region 45. The third thickness T3 is the maximum thickness of the fifth pattern region 45. For the third pattern region 43 and the fifth pattern region 45, the irradiation amount setter 32 sets the value of the second irradiation amount to increase away from the second pattern region 42 in the first direction D1. Thereby, it is possible to reflect the third pattern region 43 having the tapered surface and the fifth pattern region 45 having the tapered surface in the processing pattern data 61.

In the embodiment, the SRAF width ratio is, for example, the ratio of the second width W2 to the total of the two third widths W3, i.e., W2/(W3×2).

Figure 8A:
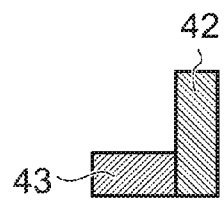
FIG. 8A and FIG. 8B are schematic views showing other pattern data according to the embodiment.
Figure 8B:
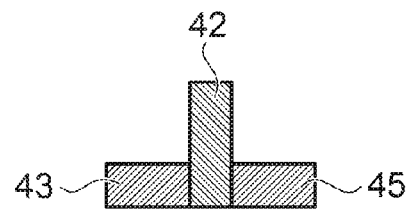

FIG. 8A and FIG. 8B are schematic views showing other pattern data according to the embodiment.

As shown in FIG. 8A, the third pattern region 43 is adjacent to one end of the second pattern region 42. The third pattern region 43 may not have a tapered surface. In other words, the width on the lower layer side and the width on the upper layer side may be the same for the third pattern region 43.

As shown in FIG. 8B, the third pattern region 43 is adjacent to one end of the second pattern region 42. The fifth pattern region 45 is adjacent to one other end of the second pattern region 42. Neither the third pattern region 43 nor the fifth pattern region 45 may have a tapered surface. In other words, the width on the lower layer side and the width on the upper layer side are the same for the third pattern region 43. The width on the lower layer side and the width on the upper layer side are the same for the fifth pattern region 45.

Third Embodiment

Figure 9A:
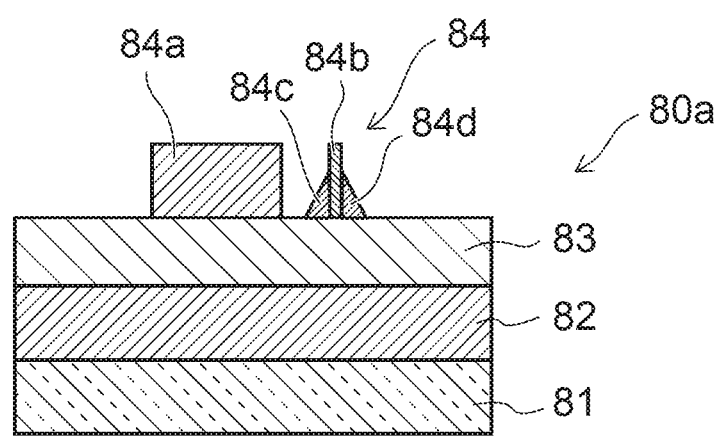
FIG. 9A and FIG. 9B are schematic cross-sectional views showing a mask according to a third embodiment.
Figure 9B:
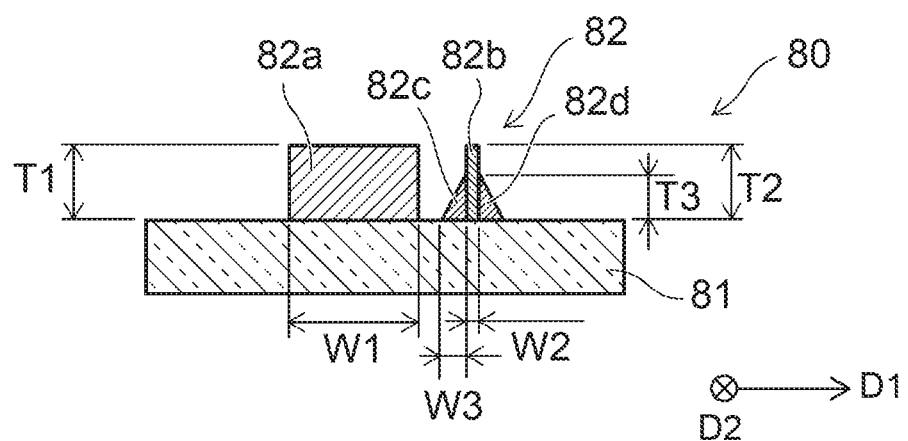

FIG. 9A and FIG. 9B are schematic cross-sectional views showing a mask according to a third embodiment.

FIG. 9A is a schematic cross-sectional view showing a mask intermediate body after the resist development.

FIG. 9B is a schematic cross-sectional view showing the mask after the patterning by etching.

The pattern data shown in FIG. 7A and FIG. 7B is used in the example.

As shown in FIG. 9A, a mask intermediate body 80a includes a substrate 81, a phase shift layer 82, a hard mask layer 83, and a resist layer 84.

The material of the substrate 81 includes, for example, quartz, synthetic quartz, etc.

The phase shift layer 82 is provided on the substrate 81. The phase shift layer 82 includes, for example, molybdenum (Mo), etc. The phase shift layer 82 may include a molybdenum silicide material. For example, a molybdenum silicide oxide film (MoSiO), a molybdenum silicide nitride film (MoSiN), a molybdenum silicide oxynitride film (MoSiON), etc., may be used.

The hard mask layer 83 is provided on the phase shift layer 82. The hard mask layer 83 includes, for example, chrome (Cr), etc.

The resist layer 84 is provided on the hard mask layer 83. A first pattern intermediate body 84a, a second pattern intermediate body 84b, a third pattern intermediate body 84c, and a fourth pattern intermediate body 84d are formed in the resist layer 84 based on the drawing conditions derived using the pattern data generation method according to the embodiment.

The first pattern region 41 is reflected in the first pattern intermediate body 84a. The second pattern region 42 is reflected in the second pattern intermediate body 84b. The third pattern region 43 is reflected in the third pattern intermediate body 84c. The fifth pattern region 45 is reflected in the fourth pattern intermediate body 84d.

A mask 80 is formed as shown in FIG. 9B. The mask 80 is formed by etching the mask intermediate body 80a, removing the resist layer 84 and the hard mask layer 83, and further removing a portion of the phase shift layer 82.

The mask 80 includes the substrate 81 and the phase shift layer 82. A first pattern 82a, a second pattern 82b, a third pattern 82c, and a fourth pattern 82d are formed in the phase shift layer 82.

The first pattern 82a is provided on the substrate 81. The first pattern 82a has the first width W1 and the first thickness T1. The first pattern 82a is transferred onto a wafer (not shown) in the formation of the mask pattern. The first pattern intermediate body 84a is transferred to form the first pattern 82a.

The second pattern 82b is provided on the substrate 81. The second pattern 82b is positioned at the vicinity of the first pattern 82a. The second pattern 82b has the second thickness T2 and the second width W2 that is narrower than the first width W1. The second pattern 82b is not transferred onto the wafer in the formation of the mask pattern. The second pattern intermediate body 84b is transferred to form the second pattern 82b.

The third pattern 82c is provided on the substrate 81. The third pattern 82c is adjacent to the second pattern 82b. The third pattern 82c has the third thickness T3 that is thinner than the second thickness T2, and the third width W3 that is narrower than the first width W1. The third pattern 82c is not transferred onto the wafer in the formation of the mask pattern. The third pattern intermediate body 84c is transferred to form the third pattern 82c.

The width of the third pattern 82c narrows continuously from the lower layer side toward the upper layer side. The width of the third pattern 82c on the lower layer side is wide; and the width of the third pattern 82c on the upper layer side is narrow. The third pattern 82c has a tapered surface. In such a case, the third width W3 is the maximum width of the third pattern 82c. The third thickness T3 is the maximum thickness of the third pattern 82c.

The fourth pattern 82d is provided to be symmetric with the third pattern 82c with respect to the second pattern 82b. In other words, the fourth pattern 82d is provided on the substrate 81. The fourth pattern 82d is adjacent to the second pattern 82b. The fourth pattern 82d has the third thickness T3 that is thinner than the second thickness T2, and the third width W3 that is narrower than the first width W1. The fourth pattern 82d is not transferred onto the wafer in the formation of the mask pattern. The fourth pattern intermediate body 84d is transferred to form the fourth pattern 82d.

The width of the fourth pattern 82d narrows continuously from the lower layer side toward the upper layer side. The width of the fourth pattern 82d on the lower layer side is wide; and the width of the fourth pattern 82d on the upper layer side is narrow. The fourth pattern 82d has a tapered surface. In such a case, the third width W3 is the maximum width of the fourth pattern 82d. The third thickness T3 is the maximum thickness of the fourth pattern 82d.

The mask 80 has a pattern size that is equal to or less than the resolution limit of the optical system.

The configuration of the mask pattern according to the embodiment is appropriately modifiable to correspond to the drawing conditions determined by the pattern data generation method.

Although a pattern data generation method and a pattern data generation device are described as an embodiment hereinabove, the embodiment may have the form of a pattern data generation program for causing a computer to execute the pattern data generation method or the form of a computer-readable recording medium in which the pattern data generation program is recorded.

Specifically, CD-ROM (-R/-RW), a magneto-optical disk, a HD (hard disk), DVD-ROM (-R/-RW/-RAM), a FD (flexible disk), flash memory, a memory card, a memory stick, other various ROM, RAM, etc., are possible as the recording medium; and the pattern data generation method of the embodiment described above is easy to realize by recording the pattern data generation program for causing the computer to execute the method in the recording medium and by distributing the pattern data generation program. The pattern data generation method of the embodiment may be executed by mounting a recording medium such as that recited above to an information processor such as a computer, etc., and the pattern data generation program being read by the information processor, or by the pattern data generation program being pre-stored in the storage medium included in the information processor and the pattern data generation program being read as necessary.

According to the embodiment, a pattern data generation method, a pattern data generation device, and a mask in which high-precision pattern data is generatable can be provided.

Hereinabove, embodiments of the invention are described with reference to specific examples. However, the invention is not limited to these specific examples. For example, one skilled in the art may similarly practice the invention by appropriately selecting specific configurations of components such as each step of the pattern data generation method, the inputter and the processor used in the pattern data generation device, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all pattern data generation methods, pattern data generation devices and masks practicable by an appropriate design modification by one skilled in the art based on the pattern data generation methods, the pattern data generation devices and masks described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method performed by a pattern data generation device for generating pattern data of a phase shift mask, the method comprising:
    setting drawing pattern data based on design pattern data, the design pattern data including a first pattern region and a second pattern region, the first pattern region corresponding to a first pattern of a mask and having a first width, the second pattern region corresponding to a second pattern and having a second width narrower than the first width, the second pattern being arranged with the first pattern, the drawing pattern data including a third pattern region and a fourth pattern region, the third pattern region being arranged with the second pattern region and having a width narrower than the first width;
    setting the width of the third pattern region to a third width;
    setting first irradiation amount data and second irradiation amount data based on the drawing pattern data, the first irradiation amount data relating to a value of a first irradiation amount per unit surface area of the fourth pattern region, the second irradiation amount data relating to a value of a second irradiation amount per unit surface area of the third pattern region, the value of the second irradiation amount being less than the value of the first irradiation amount;
    setting a first thickness of the first pattern region and a second thickness of the second pattern region based on the first irradiation amount data, and setting a third thickness of the third pattern region based on the second irradiation amount data, the third thickness being thinner than the second thickness; and
    setting, based on the first to third widths and the first to third thicknesses, a range of a first exposed region exposed onto a patterning substrate.

2. The method according to claim 1, wherein the width of the third pattern region is set to a fourth width different from the third width when the range is not contained within a first range, when a ratio of the second width to the third width is not contained within a second range, or when the range is not contained within the first range and the ratio is not contained within the second range.

3. The method according to claim 2, wherein the width of the third pattern region is set to be the third width when the range is contained within the first range and the ratio is contained within the second range.

4. The method according to claim 2, wherein
    the drawing pattern data is set based on the design pattern data, the drawing pattern data including the third pattern region having the fourth width set in the third pattern region,
    the range of the first pattern is calculated based on the first width, the second width, the fourth width, and the first to third thicknesses, and
    the width of the third pattern region is set to be the fourth width when the range is contained within the first range and a ratio of the second width to the fourth width is contained within the second range.

5. The method according to claim 1, wherein the value of the second irradiation amount increases away from the second pattern region in a first direction, the first direction being from the second pattern region toward the first pattern region.

6. The method according to claim 5, wherein
    the third width is a maximum width of the third pattern region,
    the third thickness is a maximum thickness of the third pattern region.

7. The method according to claim 1, wherein the drawing pattern data further includes a fifth pattern region arranged with the second pattern region, the second pattern region being positioned between the third pattern region and the fifth pattern region.

8. The method according to claim 1, wherein the third thickness of the third pattern region is not less than 0.3 times and not more than 0.7 times the second thickness of the second pattern region.

9. The method according to claim 1, wherein the range is determined based on a fluctuation range of an exposure amount per unit time of the patterning substrate and a fluctuation range of a focal position of the patterning substrate.

10. The method according to claim 1, wherein the mask has a pattern size not more than a resolution limit of an optical system.

11. A pattern data generation device, comprising:
    an inputter receiving input of design pattern data of a mask, the mask including a first pattern and a second pattern, the second pattern being arranged with the first pattern, the design pattern data including a first pattern region and a second pattern region, the first pattern region corresponding to the first pattern and having a first width, the second pattern region corresponding to the second pattern and having a second width narrower than the first width; and a processor configured to:
set drawing pattern data based on the design pattern data, the drawing pattern data including a third pattern region and a fourth pattern region, the third pattern region being arranged with the second pattern region to be adjacent to the second pattern region and having a width narrower than the first width,
set the width of the third pattern region to a third width,
set first irradiation amount data and second irradiation amount data based on the drawing pattern data, the first irradiation amount data relating to a value of a first irradiation amount per unit surface area of the fourth pattern region, the second irradiation amount data relating to a value of a second irradiation amount per unit surface area of the third pattern region, the value of the second irradiation amount being less than the value of the first irradiation amount,
set a first thickness of the first pattern region and a second thickness of the second pattern region based on the first irradiation amount data, and set a third thickness of the third pattern region based on the second irradiation amount data, the third thickness being thinner than the second thickness, and
set a range of a first exposed region based on the first to third widths and the first to third thicknesses, the first exposed region being exposed onto a patterning substrate.

12. The device according to claim 11, wherein the processor is further configured to:
set the width of the third pattern region to a fourth width different from the third width when the range is not contained within a first range, when a ratio of the second width to the third width is not contained within a second range, or when the range is not contained within the first range and the ratio is not contained within the second range.

13. The device according to claim 12, wherein the processor is further configured to:
set the width of the third pattern region to be the third width when the range is contained within the first range and the ratio is contained within the second range.

14. The device according to claim 12, wherein the processor is further configured to:
set the drawing pattern data based on the design pattern data, the drawing pattern data including the third pattern region having the fourth width set in the third pattern region;
calculate the range based on the first width, the second width, the fourth width, and the first to third thicknesses; and
set the width of the third pattern region to be the fourth width when the range is contained within the first range and a ratio of the second width to the fourth width is contained within the second range.

15. The device according to claim 11, wherein the processor is further configured to:
cause the value of the second irradiation amount to increase away from the second pattern region in a first direction, the first direction being from the second pattern region toward the first pattern region.

16. The device according to claim 15, wherein
the third width is a maximum width of the third pattern region, and
the third thickness is a maximum thickness of the third pattern region.

17. The device according to claim 11, wherein the drawing pattern data further includes a fifth pattern region arranged with the second pattern region, the second pattern region being positioned between the third pattern region and the fifth pattern region.

18. The device according to claim 11, wherein the third thickness of the third pattern region is not less than 0.3 times and not more than 0.7 times the second thickness of the second pattern region.

19. The device according to claim 11, wherein the range is determined based on a fluctuation range of an exposure amount per unit time of the patterning substrate and a fluctuation range of a focal position of the patterning substrate.

20. A phase shift mask, comprising:
a substrate;
a first pattern provided on the substrate, the first pattern having a first width and a first thickness;
a second pattern provided on the substrate and arranged with the first pattern, the second pattern being positioned at the vicinity of the first pattern and being an assist pattern, the second pattern having a second width and a second thickness, the second width being narrower than the first width; and
a third pattern provided on the substrate and arranged with the second pattern, the third pattern being adjacent to the second pattern and having a third thickness and a third width, the third thickness being thinner than the second thickness, the third width being narrower than the first width.

* * * * *